United States Patent [19]

Murai

[11] Patent Number: 5,789,778
[45] Date of Patent: Aug. 4, 1998

[54] SEMICONDUCTOR DEVICE WITH GATE INSULATOR FILM

[75] Inventor: Ichiro Murai, Tateyama, Japan

[73] Assignee: Nippon Steel Semiconductor Corporation, Chiba, Japan

[21] Appl. No.: 726,778

[22] Filed: Oct. 7, 1996

[30] Foreign Application Priority Data

Oct. 16, 1995 [JP] Japan ................................ 7-291701

[51] Int. Cl.$^6$ ................................................ H01L 29/792
[52] U.S. Cl. ...................... 257/325; 257/345; 257/404; 257/408; 257/411
[58] Field of Search .......................... 257/408, 336, 257/344, 404, 411, 405, 345, 395, 401, 325

[56] References Cited

U.S. PATENT DOCUMENTS

| | | | |
|---|---|---|---|
| 5,266,823 | 11/1993 | Noji et al. | 257/408 X |
| 5,422,505 | 6/1995 | Shirai | 257/345 X |
| 5,512,771 | 4/1996 | Hiroki et al. | 257/408 X |

FOREIGN PATENT DOCUMENTS

| | | | |
|---|---|---|---|
| 361256670 | 11/1986 | Japan | 257/408 |
| 404320036 | 11/1992 | Japan | 257/408 |

OTHER PUBLICATIONS

Okumara, Y., et al., "A Novel Source–to–Drain Nonuniformly Doped Channel (NUDC) MOSFET for High Current Drivability and threshold Voltage Controllability," LSI R&D Laboratory, Mitsubishi Electric Corp., 4–1 Mizuhara, Itami, Hyogo, Japan, ©1990 IEEE, IEDM 90–391, pp. 15.5.1–15.5.4.

Primary Examiner—William Mintel
Attorney, Agent, or Firm—Holland & Hart LLP

[57] ABSTRACT

A gate electrode comprises a conductive gate electrode body and gate side walls. The channel region beneath the gate electrode has an NUDC structure having a p$^-$ impurity region and p$^+$ impurity regions. The p$^-$ impurity region is formed before the gate electrode body. After the formation of the gate electrode body, the p$^+$ impurity regions are formed by ion implantation before the gate side walls. The ion implantation is carried out perpendicular to the substrate so that the implanted ions will not reach further around the center of the channel region. Of the gate oxide films over the channel region, the thickness of the gate oxide films at both ends of the channel region is thinner than that of the gate oxide film in the middle of the channel length so as to suppress lowering of the current drivability.

3 Claims, 5 Drawing Sheets

SEMICONDUCTOR DEVICE WITH GATE INSULATOR FILM

TECHNICAL FIELD

The present invention relates to a metal oxide semiconductor (MOS) device and a method of manufacturing the same. It particularly relates to a nonuniformly doped channel (NUDC) semiconductor device and a method of manufacturing the same wherein channel concentration under the gate oxide is nonuniform from source to drain in the direction of carrier movement.

BACKGROUND OF THE INVENTION

The performance and reliability of a MOS device is seriously affected by lowering of the threshold voltage, that is, the gate voltage allowing the drain current to flow, as well as degradation of the mobility of carriers drawn to the field. Threshold voltage lowering known as the short channel effect associated with microstructuring is due to the widening of the depletion region. Mobility degradation results from increasing electric field due to higher channel concentration. The latter affects the high-speed performance of the device while the former affects the correct operating point.

To overcome the problems described above, a MOS device with a structure called NUDC has been developed as discussed in Y. Okumura et al., 'A Novel Source-to-Drain Nonuniformly Doped Channel (NUDC) MOSFET for High Current Drivability and Threshold Voltage Controllability', IEDM Tech. Dig. p. 391, 1990. In this device, the concentration of the channel near the source to drain is increased to suppress the widening of the depletion region while the concentration in the middle of the channel is decreased to improve the mobility.

FIG. 9A shows a schematic cross section of an n-type NUDC MOSFET (field effect transistor). As the figure shows, a gate electrode 104 is formed via a gate oxide 103 over a low concentration p$^-$ well 102 formed on a p-type silicon substrate 101 wherein the gate length (channel length) is patterned to be 'L' in the figure. On each side of the gate electrode 104, each of high concentration n$^+$ regions 105 and 106 is formed as the source and drain respectively in a self-aligned manner with the gate electrode 104. Beneath the n$^+$ regions 105 and 106, high concentration p$^+$ regions 107 and 108 are formed. One end of each of the p$^+$ regions 107 and 108 reaches the base of the gate electrode 104, that is, part of the channel region ($\Delta$L in the figure from the source and the drain respectively).

FIG. 9B shows the profile of the channel region concentration formed beneath the gate electrode 104 in FIG. 9A. The horizontal axis indicates a position in the direction of the channel length. The vertical axis shows concentration. As shown in this figure, concentration N$_{TH1}$ is high since the p$^+$ regions 107 and 108 reach part of the channel region, that is, from 0 to $\Delta$L and from L $-\Delta$L to L in the figure, adjacent to the n$^+$ regions 105 and 106 as the source and drain respectively. On the other hand, concentration N$_{TH2}$ of the p$^-$ well 102 is low in the middle of the channel region (from $\Delta$L to L $-\Delta$L). Therefore, a semiconductor device with the structure thus described suppresses lowering of the threshold voltage due to the widening depletion region as well as suppresses degradation of the carrier mobility.

A semiconductor device with the NUDC structure has been manufactured using the oblique rotating ion implantation technique. This ion implantation technique as shown in FIG. 9A is designed to implant impurity (p impurity in this example) of the same conductivity type as the p$^-$ well 102 into the region other than the area beneath the gate electrode 104 in a rotating manner in an oblique direction.

However, the oblique rotating ion implantation technique makes it difficult to control the concentration of the substrate (the p$^-$ well 102 in FIG. 9A) and the profile in the direction of the dose depth. Another problem is that when the gate length is shortened due to microstructuring of the device, oblique rotating implantation may allow the impurity to reach under the gate electrode, leading to loss of the low concentration region in the center of the channel region.

In general, the current drivability of a MOS transistor depends on the impurity concentration in the channel region. If the concentration becomes higher, the mobility will be reduced while the threshold voltage goes high. This leads to the degradation of the current drivability of the MOS transistor. Therefore, while the conventional NUDC MOS transistor can suppress the lowering of the threshold voltage due to the short channel effect, the degradation of the current drivability may occure at both sides of the channel region (adjacent to the source-drain region) when the concentration thereof is higher. The current drivability of the MOS transistor itself may be thus reduced.

SUMMARY OF THE INVENTION

The present invention is designed to overcome the problems described above. It is an objective of the invention to provide a semiconductor device and a method of manufacturing the same which provides for an NUDC structure with good controllability in the channel region even when the gate length is shortened due to the demand for microstructuring and suppresses the degradation of the current drivability.

A semiconductor device of the present invention is a MOS device with a gate electrode on a semiconductor substrate via a gate insulator film, comprising a channel region wherein the impurity concentration thereof is nonuniformly distributed in the direction of the carrier movement and wherein the thickness of the gate insulator film is nonuniform in the direction of the carrier movement.

In accordance with the semiconductor device of the present invention, it is possible to adjust the level of the MOS transistor characteristics since the gate insulator film is formed whose thickness corresponds to the profile of the concentration in the direction of the carrier movement in the channel region.

The semiconductor device of the present invention is configured such that the concentration is low in the middle of the channel region in the direction of the carrier movement while that of both ends of the channel region is high, and the middle of the gate insultor film is thick in the direction of the carrier movement while both ends of the gate insultor film are thin.

The semiconductor device of the present invention provides an NUDC MOS transistor which suppresses the degradation of the current drivability as well as lowering of the threshold voltage due to the short channel effect since the middle of the gate insulator film is thickly manufactured while both ends thereof is thinly manufactured in the direction of the carrier movement.

The semiconductor device of the present invention comprises the gate electrode having a conductive gate electrode body and conductive gate side walls formed at the sides of the gate electrode body. The semiconductor device provides the gate electrode body and the gate side walls combined together to function as a gate electrode.

In the semiconductor device of the invention, the channel region comprises high concentration regions formed beneath the gate side walls and a low concentration region formed beneath the gate electrode body. The gate insulator films in the high concentration regions are thinly manufactured while that in the low concentration region is thickly manufactured. The semiconductor device suppresses the lowering of the threshold voltage due to the short channel effect since the NUDC structure of the channel region is configured with the low concentration region formed beneath the gate electrode body and the high concentration regions formed beneath the gate side walls. The device also suppresses the degradation of the current drivability since the gate insultor films in the high concentration regions are thinly manufactured while that in the low concentration region is thickly manufactured.

A method of manufacturing the foregoing semiconductor device is to manufacture a MOS device by forming a gate electrode on a semiconductor substrate of one conductivity type via a gate insulator film, including: a) a step to form a first gate insulator film of a certain thickness on the semiconductor substrate; b) a step to form a first impurity region of the one conductivity type with a certain impurity concentration in proximity to the surface of the semiconductor substrate; c) a step to selectively form a conductive gate electrode body on the first gate insulator film; d) a step to form a second impurity region of the one conductivity type in proximity to the semiconductor substrate surface other than the region where the gate electrode body is formed in a self-aligned manner with the gate electrode body wherein the impurity concentration thereof is different from that of the first impurity region; e) a step to remove the first gate insulator film on the semiconductor substrate except the region where the gate electrode body is formed after the second impurity region is formed and to form a second gate insulator film where the first gate insulator film is removed, whose thickness is different from that of the first gate insulator film; f) a step to form conductive gate side walls at the sides of the gate electrode body; and g) a step to form an impurity region of the other conductivity type as a source-drain region by ion implantation of impurity of the other conductivity type into the semiconductor substrate in a self-aligned manner with the gate electrode comprising the gate electrode body and the gate side walls.

According to the present method of manufacturing the semiconductor device, the first impurity region of the one conductivity type is formed in the region beneath the gate electrode body on the semiconductor substrate. The second impurity region of the one conductivity type is formed whose impurity concentration is different from that of the first impurity region, in the region other than the region where the gate electrode body is formed on the semiconductor substrate. Then, the second gate insulator film is formed whose thickness is different from that of the first gate insulator film, instead of the first gate insulator film in the second impurity region of the one conductivity type. The gate side walls are then formed followed by ion implantation to form the impurity region of the other conductivity type as the source-drain region in a self-aligned manner with the gate electorde comprising the gate electrode body and the gate side walls.

A method of manufacturing the semiconductor device is to manufacture a MOS device by forming a gate electrode on a semiconductor substrate of one conductivity type via a gate insulator film, including: a) a step to form a first gate insulator film of a certain thickness on the semiconductor substrate; b) a step to form a first impurity region of the one conductivity type with a certain impurity concentration in proximity to the surface of the semiconductor substrate; c) a step to selectively form a conductive gate electrode body on the first gate insulator film; d) a step to remove the first gate insulator film on the semiconductor substrate except the region where the gate electrode body is formed and to form a second gate insulator film where the first gate insulator film is removed, whose thickness is different from that of the first gate insulator film; e) a step after the second gate insulator film is formed, to form a second impurity region of the one conductivity type in proximity to the semiconductor substrate surface other than the region where the gate electrode body is formed in a self-aligned manner with the gate electrode body wherein the impurity concentration thereof is different from that of the first impurity region; f) a step to form conductive gate side walls at the sides of the gate electrode body; and g) a step to form an impurity region of the other conductivity type as a source-drain region by ion implantation of impurity of the other conductivity type into the semiconductor substrate in a self-aligned manner with the gate electrode comprising the gate electrode body and the gate side walls.

According to the method of manufacturing the semiconductor device, the first gate insulator film is formed on the semiconductor substrate, beneath which the first impurity region is formed of the one conductivity type. Then, the second gate insulator film is formed in the region other than the region where the gate electrode body is formed, wherein the thickness of the second insulator film is different from that of the first gate insulator film. The second impurity region of the one conductivity type is then formed, on the semiconductor substrate beneath the region where the second gate insulator film is formed, wherein the impurity concentration thereof is different from that of the first impurity region of the one conductivity type. The gate side walls are then formed followed by ion implantation to form the impurity region of the other conductivity type as the source-drain region in a self-aligned manner with the gate electrode comprising the gate electrode body and the gate side walls.

According to the method of manufacturing the semiconductor device, the impurity concentration of the second impurity region of the one conductivity type is higher than that of the first impurity region of the one conductivity type. The thickness of the second gate insulator film is thinner than that of the first gate insulator film. This method provides a channel region wherein the impurity concentration is high at both ends in the direction of carrier movement while the concentration in the middle is low. The method also provides a gate oxide which is thick in the middle in the direction of carrier movement and thin at both ends.

DESCRIPTION OF THE PREFERRED EMBODIMENT

A preferred embodiment of the present invention will now be described in detail with reference to the accompanying drawings.

Figure 1:
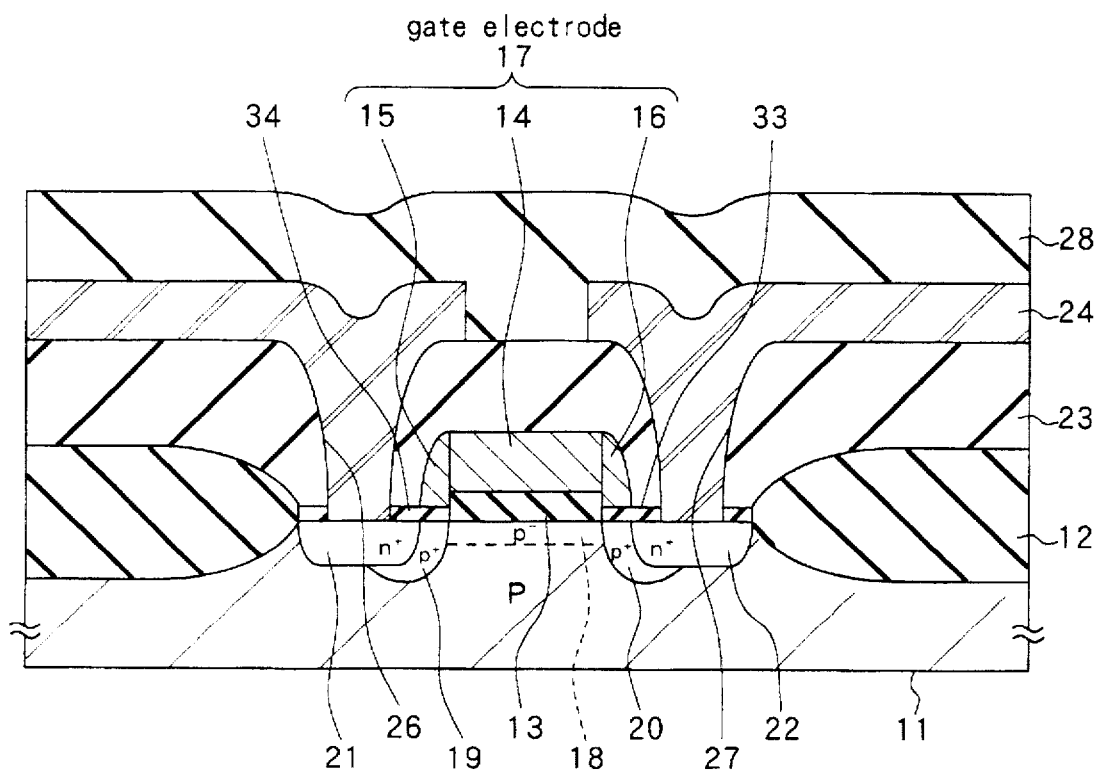
FIG. 1 is a vertical cross section showing the configuration of a NUDC MOS transistor relating to an embodiment of the present invention.

FIG. 1 shows a cross section of the semiconductor device relating to an embodiment of the invention. Hereinafter an n-type MOS FET with an NUDC is taken as an example.

As shown in the figure, a field oxide film 12 of the order of 7000 Å in thickness, made of a silicon dioxide ($SiO_2$) is selectively formed on a p-type silicon substrate 11. A gate oxide film 13 (a gate insulator film) of silicon dioxide of the order of 120 Å in thickness is selectively formed in the active region on the substrate surface divided by the field oxide film 12. A gate electrode body 14 as a conductive layer is formed on the gate oxide film 13.

Gate oxide films 33 and 34 of silicon dioxide are formed at each side of the gate oxide film 13 respectively, on the silicon substrate 11. The thickness of the gate oxide films 33 and 34 is of the order of 80 to 100 Å, thinner than that of the gate oxide film 13. Gate side walls 15 and 16 are formed on the gate oxide films 33 and 34 respectively, as conductive layers in electrically contact with both sides of the gate electrode 14. The gate electrode body 14 and the gate side walls 15 and 16 all of which form a gate electrode 17, are made of polycrystalline silicon including phosphorous (P) as n-type impurity. It is one of the features of the invention that the gate electrode 17 comprises the gate electrode body 14 and the gate side walls 15 and 16 made of the conductive layers of the same conductivity type (n type) to achieve an NUDC structure.

A channel region of the NUDC is formed in the silicon substrate 11 beneath the gate oxide film 13 and the gate oxide films 33 and 34 where the gate electrode 17 is formed. That is, the channel region comprises p-type impurity region 18 of low concentration formed in the middle in the direction of the channel length wherein the carriers move and $p^+$ impurity regions 19 and 20 formed at each end of the channel in the direction of the length thereof beneath the gate side walls 15 and 16 wherein concentration profile is nonuniform. Of these impurity regions, the $p^-$ impurity region 18 is formed before the gate electrode body 14. The $p^+$ impurity regions 19 and 20 are formed before the side walls 15 and 16, in a self-aligned manner with the gate electrode body 14 after its formation. Both $p^-$ and $p^+$ impurity regions 18, 19 and 20 are formed by ion implantation of boron (B) as p-type impurity into the substrate in a vertical direction. That is, the implanted ions will not reach the proximity of the center of the channel region since the $p^+$ impurity regions 19 and 20 are not formed by the former oblique rotating ion implantation. Therefore, it is another feature of the invention that the low concentration impurity region in the center of the channel region will not be lost even when the channel length is short and thus desired concentration profile will be precisely achieved in the direction of the channel length.

As described above, it is still another feature of the invention to suppress the degradation of the current drivability of the MOS transistor. This is achieved through the gate oxide film beneath the gate electrode 17 which is thick in the center in the direction of the channel (gate) length (right to left in the figure) (the gate oxide film 13) and is thin at both ends (part of the gate oxide films 33 and 34).

In general, the current drivability $I_{sd}$ of a MOS transistor holds equation (1) in relation to carrier mobility μ, gate voltage $V_G$ and threshold voltage $V_T$.

$$I_{sd} \sim \mu^* C_{OX}^* (V_G - V_T) \tag{1}$$

wherein $C_{OX}$ is the gate capacity inversely proportional to the gate oxide thickness $t_{OX}$. Equation (2) thus holds:

$$I_{sd} \sim \mu^* (V_G - V_T)/t_{OX} \tag{2}$$

As shown in FIG. 1, if the $p^+$ impurity regions 19 and 20 are formed at both ends of the channel region to increase the concentration at both ends of the channel region of the MOS transistor, the threshold voltage $V_T$ thereof will increase so that lowering of the threshold voltage due to the short channel effect will be suppressed. At the same time, however, the mobility μ will be reduced in the $p^+$ regions 19 and 20 while the threshold voltage $V_T$ increases. Therefore, the current drivability $I_{sd}$ will be reduced according to equation (2). That is, the problem of degradation of the current drivability $I_{sd}$ still remains when the concentration profile is made nonuniform in the channel region in the direction of the channel length.

The embodiment of the invention solves the problem of degradation of the current drivability by varying the gate oxide thickness $t_{OX}$ corresponding to the nonuniform concentration profile of the channel region. That is, as apparent in equation (2), it is noted that the current drivability $I_{sd}$ increases if the gate oxide thickness $t_{ox}$ is thinly manufactured. Therefore, the gate oxide films 33 and 34 at both ends of the channel region (the $p^+$ regions 19 and 20) are made thinner than the gate oxide film 13 in the center (the $p^-$ impurity region 18) of the channel region in the direction of the channel length so as to suppress degradation of the current drivability $I_{sd}$. It is thus possible to suppress lowering of the threshold voltage due to the short channel effect without degradation of the current drivability $I_{sd}$.

$N^+$ impurity regions 21 and 22 of high concentration are formed as the source-drain region in the active region adjacent to the gate electrode 17 in proximity to the surface of the silicon substrate 11. The $n^+$ impurity regions 21 and 22 are formed in a self-aligned manner with the gate electorde 17 by ion implantation of, for example, arsenic (As) of n-type impurity.

An interlayer insulator 23 is formed to cover all the structure described above. The interlayer insulator 23 is made of boron phosphorous silicate glass (BPSG) as a reflow film. Over the interlayer insulator 23, metal wiring layers 24 are selectively formed, made of, for example, an alloy of aluminum and silicon. The metal wiring layers 24 form contacts with the source-drain region (the $n^+$ impurity regions 21 and 22) via the contact holes 26 and 27 selectively formed in the interlayer insulator 23. A surface protection film 28 is further formed to cover the structure described above, made of SiN film (silicon nitride film).

A method of manufacturing the MOS FET with the configuration as above will now be described.

Figure 2:
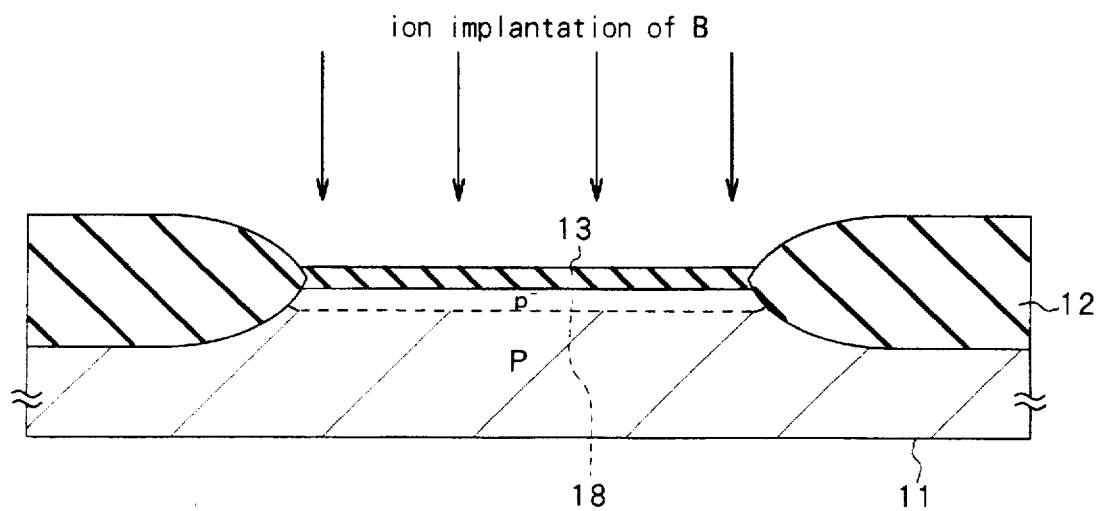
FIG. 2 is a vertical cross section showing a manufacturing step of the MOS transistor in FIG. 1.

First, as shown in FIG. 2, the field oxide film 12 as an insulator of a silicon dioxide film ($SiO_2$) is formed using the local oxidation of silicon (LOCOS) on the silicon substrate 11 with p-type impurity of the order of $1.5 * 10^{15}$ atoms/cm³ and the resistivity of 1 to 10 ohm*cm. The thickness is, for example, 5000 to 8000 Å. Then, the gate oxide 13 of silicon dioxide of 100 to 500 Å is formed by thermal oxidation. As shown in FIG. 2, the p$^-$ impurity region 18 of (1 to 3) * $10^{16}$ atoms/cm$^3$ is formed in a shallow region in proximity to the surface of the silicon substrate 11 by ion implantation of boron (B) as p-type impurity. The dose thereof is, for example, $1.0*10^{12}$ to $1.0*10^{13}$ ions/cm$^2$. The implantation energy is of the order of 10 to 30 keV. The implantation is carried out in an ordinary manner perpendicular to the substrate.

Figure 3:
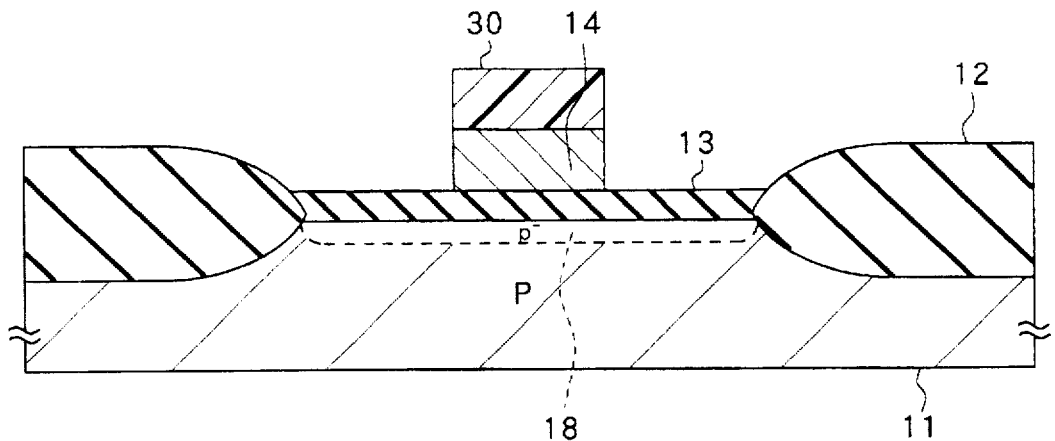
FIG. 3 is a vertical cross section showing a manufacturing step following FIG. 2.

Next, as shown in FIG. 3, a polycrystalline layer is accumulated all over the surface by chemical vapor deposition (CVD) with a thickness of 1000 to 3000 Å wherein phosphorous of $1.0 * 10^{20}$ to $1.0 * 10^{21}$ atoms/cm$^3$ as n-type impurity is contained. A resist film 30 is formed over the polycrystalline layer by lithography. The resist 30 is patterned to be a mask for forming the gate electrode body 14 by anisotropic dry etching.

Figure 4:
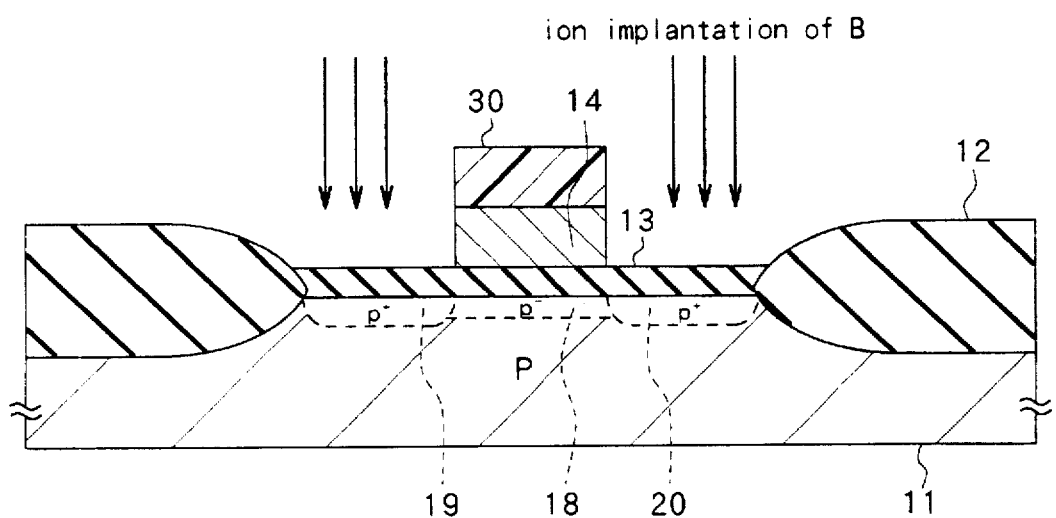
FIG. 4 is a vertical cross section showing a manufacturing step following FIG. 3.

As shown in FIG. 4, boron as p-type impurity is implanted in the active region other than the resist 30 on the gate electrode body 14 as a mask so as to form the p$^+$ impurity regions 19 and 20 as both ends of the channel region. The dose thereof is, for example, of the order of $1*10^{11}$ to $1*10^{12}$ ions/cm$^2$. The implantation energy is, for example, 30 to 50 keV. The implantation is carried out in an ordinary manner perpendicular to the substrate. As a result, the p$^+$ impurity regions 19 and 20 are formed with the concentration of (0.5 to 1.0) * $10^{17}$ atoms/cm$^3$ in a self-aligned manner with the gate electrode body 14 without the implanted ions further reaching under the gate electorde body 14.

Figure 5:
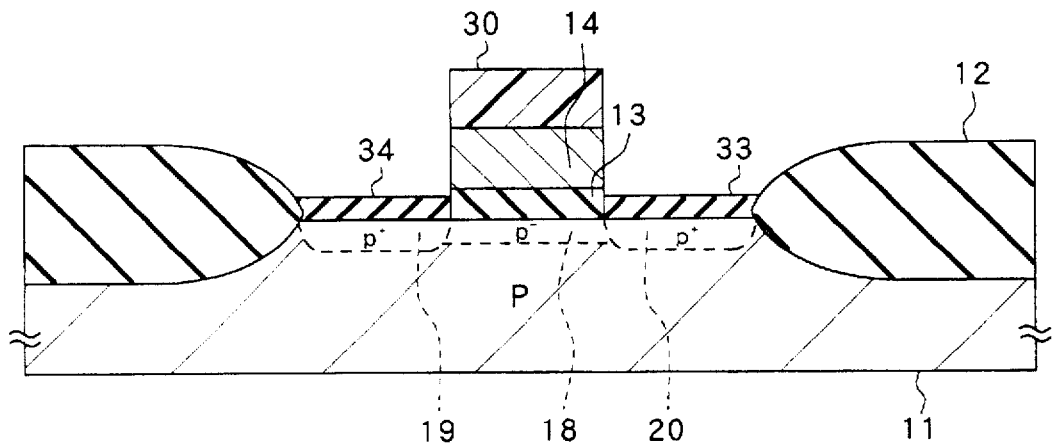
FIG. 5 is a vertical cross section showing a manufacturing step following FIG. 4.

As shown in FIG. 5, the gate oxide 13 is removed except the region beneath the gate electrode body 14, that is, the region over the p$^+$ impurity regions 19 and 20 is removed wherein the gate oxide films 33 and 34 of 50 to 500 Å thick are formed again by a method like thermal oxidation. It is noted that the thickness of the gate oxide films 33 and 34 is thinner than the gate oxide film 13 within the range stated above. It is therefore possible to lower the threshold voltage raised in the p$^+$ impurity regions 19 and 20 to suppress degradation of the current drivability.

Although in this embodiment the gate oxide films 33 and 34 are formed after the ion implantation for forming the p$^+$ impurity regions 19 and 20, these steps may be in the reverse order, that is, the p$^+$ impurity regions 19 and 20 are formed by ion implantation followed by the formation of the gate oxide films 33 and 34.

Figure 6:
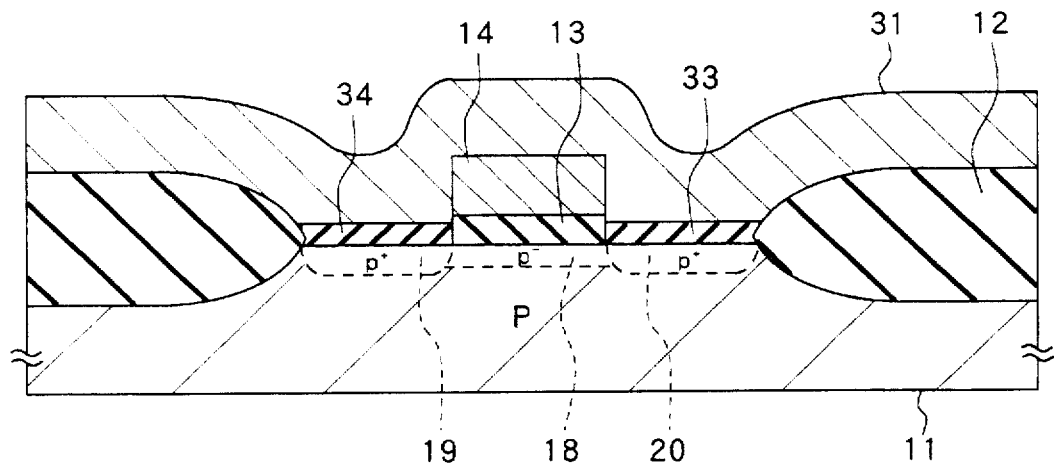
FIG. 6 is a vertical cross section showing a manufacturing step following FIG. 5.
Figure 7:
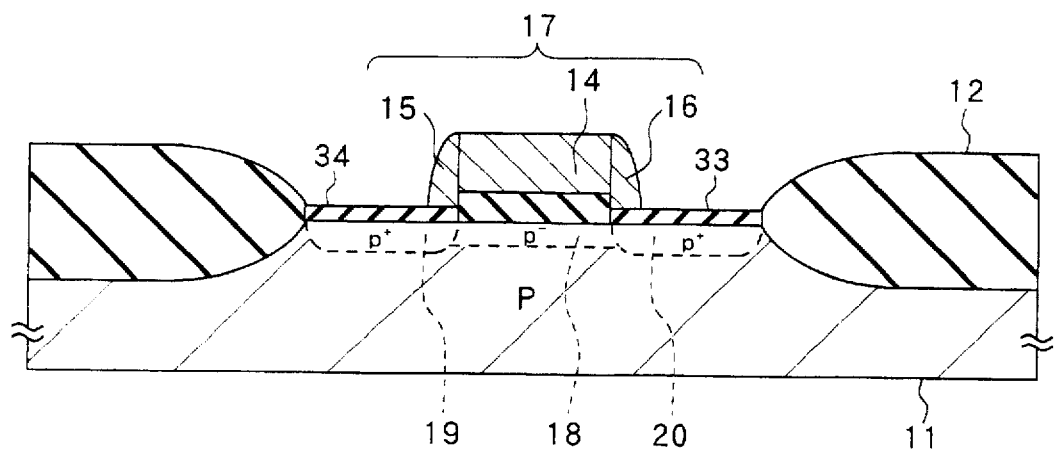
FIG. 7 is a vertical cross section showing a manufacturing step following FIG. 6.

As shown in FIG. 6, after removing the resist film 30, a polycrystalline silicon layer 31 with a thickness of 1000 to 5000 Å is accumulated all over the surface by CVD wherein phosphorous as n-type impurity of $1.0*10^{20}$ to $1.0* 10^{21}$ atoms/cm$^3$ is contained. As shown in FIG. 7, the polycrystalline silicon layer 31 is etched to form the gate side walls 15 and 16 by anisotropic dry etching such as reactive ion etching (RIE). The gate electrode 17 comprising the gate electrode body 14 and the gate side walls 15 and 16 is thus formed.

Figure 8:
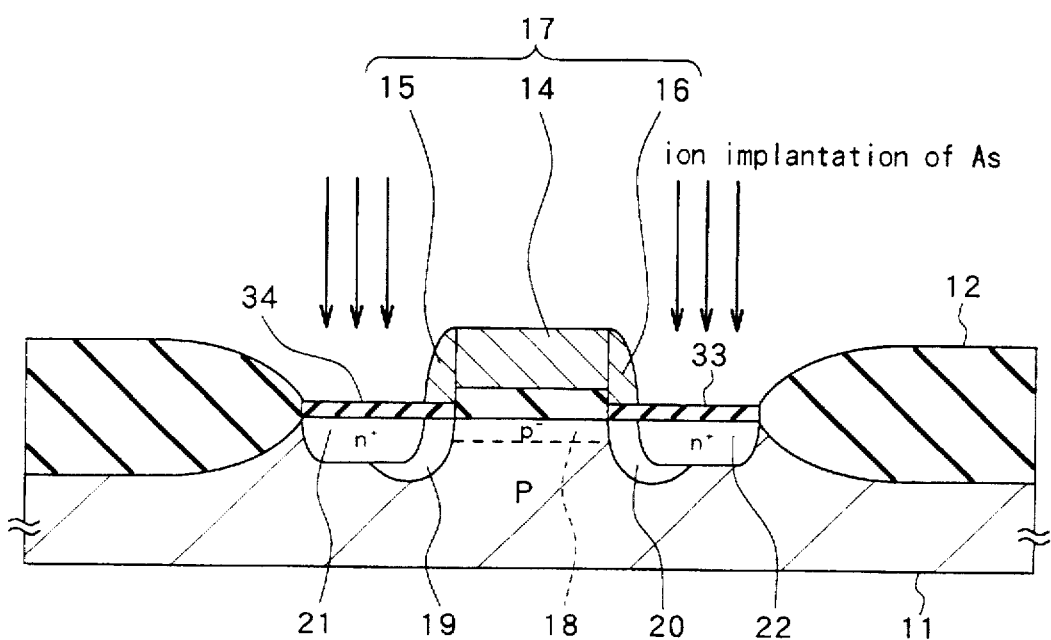
FIG. 8 is a vertical cross section showing a manufacturing step following FIG. 7.
Figure 9A:
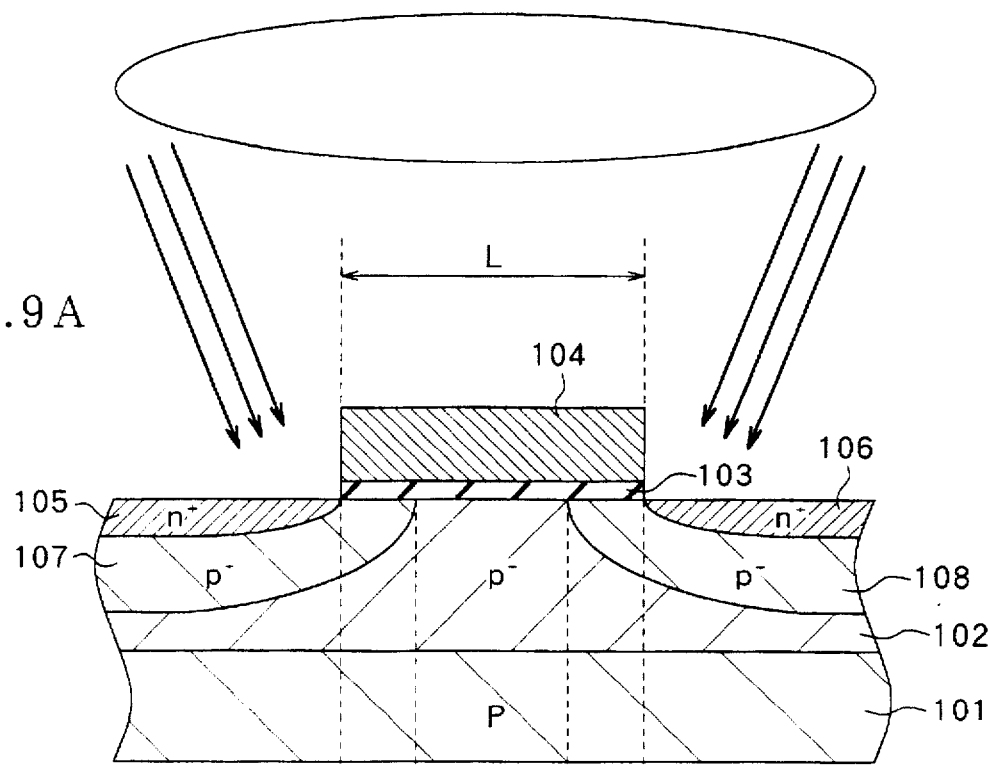
FIG. 9A is a vertical cross section showing the structure of a conventional NUDC MOS transistor.
Figure 9B:
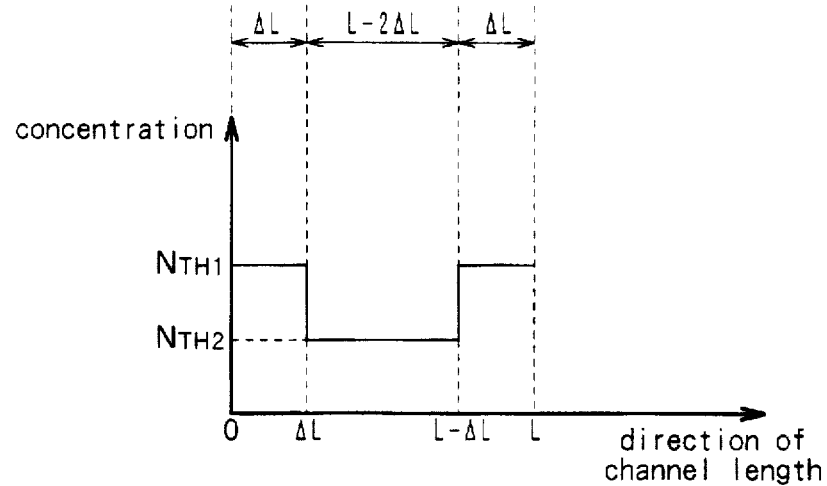
FIG. 9B is a concentration profile in the direction of carrier movement of the channel region of the NUDC.

As shown in FIG. 8, the n$^+$ impurity regions 21 and 22 of $1.0*10^{20}$ to $1.0*10^{21}$ atoms/cm$^3$ as the source-drain region is formed, the depth of which is 0.2 to 0.3 μm, by ion implantation of arsenic (As) as n-type impurity into the active region in a self-aligned manner with the gate electorde 17. The dose of the ion implantation is of the order of $1.0*10^{15}$ to $1*10^{16}$ ions/cm$^2$. The implantation energy is, for example, of the order of 80 keV. The implantation is carried out in an ordinary manner perpendicular to the substrate.

Next, as shown in FIG. 1, the interlayer insulator 23 of a BPSG film is accumulated of the order of 5000 to 10000 Å by CVD. The contact holes 26 and 27 are formed in the interlayer insulator 23 to reach the n$^+$ impurity regions 21 and 22, by lithography and dry etching. Next, a metal wiring layer of an aluminum/silicon alloy is formed all over the surface by spattering, whose thickness is of the order of 5000 to 10000 Å. The metal wiring layer is patterned to form the metal wiring layer 24 by lithography and dry etching. Finally, a SiN layer (silicon nitride) is accumulated all over the surface by plasma CVD of 10000 Å in thickness to form the surface protection film 28. The manufacturing steps of the nMOS FET with the NUDC structure are thus completed.

In the embodiment, as shown in the foregoing description, the low concentration region (the p$^-$ impurity region 18) in the center of the channel region in the direction of the length is formed before forming the gate electrode body 14 to adjust the threshold voltage $V_T$. The high concentration region (the p$^+$ impurity regions 19 and 20) adjacent to the source-drain region is formed by ion implantation in a self-aligned manner with the gate electrode body 14 after its formation before the gate side walls 15 and 16. It is also noted that the ion implantation is done in a direction perpendicular to the substrate so that the implanted ions will not reach close to the center of the channel region. As a result, even if the channel length is shortened due to microstructuring of the device, the high concentration region at both ends of the channel region will not be too enlarged to lose the low concentration region in the center of the channel. It is also possible that desired concentration profile is achieved both in the length and the depth of the channel.

With regard to the gate oxide beneath the gate electrode 17, the gate oxide 13 in the center of the channel in the direction of the length is thick while part of the gate oxide films 33 and 34 at both ends of the channel is thin. It is thus possible to suppress lowering of the current drivability due to the threshold voltage raised at both ends of the channel.

The present invention is not limited to the embodiment described above but may be practiced in still other ways without departing from the characteristics thereof. For example, the gate electrode body 14 may be of polycide structure wherein a metal silicide (a metal/silicon alloy layer) is laid over a polycrystalline silicon layer, instead of the gate electorde 14 comprising only a polycrystalline silicon layer containing phosphorous of the embodiment.

It is also possible to omit the manufacturing step to form the p$^-$ impurity region 18 beneath the gate electrode body 14 by ion implantation of boron after the gate oxide 13 is formed. Instead, the silicon substrate 11 containing p-type impurity can be used as the low concentration impurity region.

Although the embodiment describes the n-type MOS FET, the configuration and manufacturing method of the invention can be applied to a PMOS FET. In this case, the silicon substrate 11 is of an n type. An n$^-$ impurity region and n$^+$ impurity region are formed instead of the p$^-$ impurity region 18 and p$^+$ impurity regions 19 and 20 respectively while a p$^+$ impurity region is formed instead of the n$^+$ impurity regions 21 and 22.

Furthermore the configuration and the manufacturing method of the invention are applicable to semiconductor memories such as a DRAM and a SRAM.

What is claimed is:

1. A semiconductor device which is a MOS device with a gate electrode on a semiconductor substrate via a gate insulator film, comprising:

a channel region wherein the impurity concentration in a middle region thereof is low in the direction of the carrier movement while that of both ends thereof is high; and the middle of said gate insulator film is thick in the direction of the carrier movement while both ends of said gate insulator film are thin.

2. A semiconductor device which is a MOS device with a gate electrode on a semiconductor substrate via a gate insulator film, comprising:

a channel region wherein the impurity concentration in a middle region thereof is low in the direction of the carrier movement while that of both ends thereof is high, wherein the middle of said gate insulator film is thick in the direction of the carrier movement while both ends of said gate insulator film are thin; and said gate electrode has a conductive gate electrode body and conductive gate side walls separately formed at the sides of said gate electrode body.

3. A semiconductor device according to claim 2 wherein:

the channel region comprises high concentration regions formed beneath said gate side walls and a low concentration region formed beneath said gate electrode body; and thicknesses of said gate insulator film in the high concentration regions are thinner than a thickness of said gate insulator film in the low concentration region.

* * * * *